(12) United States Patent
Swart (10) Patent No.: US 12,035,427 B2
(45) Date of Patent: Jul. 9, 2024

(54) ALTERNATOR MODULATION FOR CONTROL OF EXHAUST HEATING ELEMENT

(71) Applicant: PACCAR Inc, Bellevue, WA (US)

(72) Inventor: Charles Wayne Reinhardt Swart, Bellingham, WA (US)

(73) Assignee: PACCAR Inc., Bellevue, WA (US)

( * ) Notice: Subject to any disclaimer, the term of this patent is extended or adjusted under 35 U.S.C. 154(b) by 82 days.

(21) Appl. No.: 17/590,063

(22) Filed: Feb. 1, 2022

(65) Prior Publication Data

US 2022/0243631 A1 Aug. 4, 2022

Related U.S. Application Data

(60) Provisional application No. 63/144,368, filed on Feb. 1, 2021.

(51) Int. Cl.
| | |
|---|---|
| *H05B 3/00* | (2006.01) |
| *G01R 31/371* | (2019.01) |
| *G08B 21/18* | (2006.01) |
| *H01M 10/42* | (2006.01) |
| *H01M 10/48* | (2006.01) |

(Continued)

(52) U.S. Cl.
CPC ......... *H05B 3/0019* (2013.01); *G01R 31/371* (2019.01); *G08B 21/18* (2013.01); *H01M 10/488* (2013.01); *H02J 7/0045* (2013.01); *H02J 7/0047* (2013.01); *H02P 9/14* (2013.01); *H05B 1/0236* (2013.01); *H01M 2010/4271* (2013.01); *H01M 2010/4278* (2013.01)

(58) Field of Classification Search
CPC .. H05B 3/0019; H05B 1/0236; G01R 31/371; G08B 21/18; H01M 10/488; H01M 2010/4271; H01M 2010/4278; H02J 7/0045; H02J 7/0047; H02P 9/14; Y02E 60/10; Y02T 10/12; F01N 9/00; F01N 2240/16; F01N 3/2013
See application file for complete search history.

(56) References Cited

U.S. PATENT DOCUMENTS 5,806,307 A * 9/1998 Aoki ..................... F01N 3/2013
60/284
5,822,983 A * 10/1998 Ikeda ................... F01N 3/2013
60/284

(Continued)

OTHER PUBLICATIONS

International Search report and Written Opinion for PCT/US2022/014760, mailed Apr. 8, 2022.

(Continued)

*Primary Examiner* — Brandon D Lee
(74) *Attorney, Agent, or Firm* — Merchant & Gould P.C.

(57) ABSTRACT

Systems and methods for modulating power provided to a heating element of a vehicle exhaust system is provided. One system includes a controller controlling a switch, and an alternator having a first field terminal input, wherein the first field terminal input is connected to the switch. The system further includes a heating element connected to at least an output of the alternator. The controller is configured to determine a power demand for the electric heating element and modulate the first field terminal input to cause the alternator to provide power to the heating element according to the power demand.

19 Claims, 9 Drawing Sheets

(51) Int. Cl.
  *H02J 7/00* (2006.01)
  *H02P 9/14* (2006.01)
  *H05B 1/02* (2006.01)

(56) References Cited

U.S. PATENT DOCUMENTS

| | | |
|---|---|---|
| 9,512,757 B2 | 12/2016 | Boggs |
| 2012/0003131 A1 | 1/2012 | Ibrahim et al. |
| 2015/0275724 A1* | 10/2015 | Boggs .................... F01N 3/035 60/295 |
| 2018/0142630 A1 | 5/2018 | Boggs |
| 2021/0123368 A1* | 4/2021 | Akyildiz ............ B01D 53/9477 |
| 2023/0258726 A1 | 8/2023 | Kessels |

OTHER PUBLICATIONS

PCT International Preliminary Report on Patentability in International Application PCT/US2022/014760, mailed Aug. 10, 2023, 7 pages.

* cited by examiner

ALTERNATOR MODULATION FOR CONTROL OF EXHAUST HEATING ELEMENT

CROSS-REFERENCE TO RELATED APPLICATIONS

The present application claims priority from U.S. Provisional Patent Application No. 63/144,368, filed on Feb. 1, 2021, the disclosure of which is hereby incorporated by reference in its entirety.

BACKGROUND

Government agencies enforce requirements for reduction in NOx emissions. For example, the California Air Resources Board (ARB) has mandated a NOx emissions level of 0.02 g/bhp-hr for the composite FTP cycle for 2027. Vehicles regulate NOx emission levels, in part, by incorporating catalysts into their exhaust systems. In examples, a heating element (eHeater) is used to increase the effectiveness of the catalyst in the exhaust system.

For example, an eHeater may be placed in a vehicle's exhaust system in order to activate a catalyst used, e.g., to lower NOx emissions. Conventional methods of implementing an eHeater involve use of a fixed-voltage output of a motor/generator being selectively applied to a heater by way of a switch controlled by a microprocessor. Such a fixed-voltage output, typically a fixed voltage output of an alternator that is regulated to be maintained at +48V, is both delivered to the eHeater selectively via the switch, and provided, through conversion at a DC-DC converter to a +12V level, to additional vehicle loads.

Use of such existing circuitry and systems used in delivering power to an eHeater results in relatively low total harmonic distortion (THD), which is advantageous for the DC-DC converter to deliver a reliable, lower voltage signal for use elsewhere within an electrical system of the vehicle. However, it is relatively expensive to implement, because of the required additional circuit elements involved to maintain such a low-distortion signal.

SUMMARY

In general, the present disclosure relates to a circuit for controlling power output to an exhaust heating element, and method of operation of such a circuit. The circuit, in some aspects, uses a microprocessor to actuate a switch and selectively modulate a field coil of a motor/generator, such as an alternator. Additionally, in some aspects, an output of a motor/generator may be a variable voltage, rather than including circuit elements for maintaining a constant voltage, as is the case in existing control circuits.

In a first aspect, a system for modulating power provided to an electric heating element of a vehicle exhaust system is provided. The system includes a controller controlling a switch, and an alternator having a first field terminal input, wherein the first field terminal input is connected to the switch. The system further includes an electric heating element connected to at least an output of the alternator. The controller is configured to determine a power demand for the electric heating element and modulate the first field terminal input to cause the alternator to provide power to the electric heating element according to the power demand.

In a second aspect, a method of delivering power to an electric heating element of a vehicle exhaust system is provided. The method includes initializing a voltage output at a generator output terminal of an alternator with an initial input voltage. The method further includes determining, at a controller, a power demand for an electric heating element, the electric heating element being electrically connected to the generator output terminal. The method also includes actuating, by the controller, a switch that is electrically connected to a first field terminal of the alternator to modulate power output from the alternator at a generator output terminal and delivered to the electric heating element in accordance with the calculated power level.

In a third aspect, a system for modulating power provided to an electric heating element of a vehicle exhaust system is provided. The system includes an alternator having a first field terminal, a second field terminal, and a generator output terminal, and a controller controlling a switch electrically connected between the first field terminal and a chassis ground. The system further includes an electric heating element directly electrically connected to the generator output terminal, and a voltage source electrically connected to the second field terminal. The system also includes a first diode electrically connected between the generator output terminal and the second field terminal, and a second diode electrically connected between the voltage source and the second field terminal.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following figures.

DETAILED DESCRIPTION

As briefly described above, embodiments of the present invention are directed to a circuit for controlling power output to an exhaust heating element, and a method of operation of such a circuit. The circuit, in some aspects, uses a controller, such as a microprocessor, to actuate a switch and selectively modulate a field coil of a motor/generator, such as an alternator.

The present circuit systems and methods can be used by any vehicle exhaust system employing an electric heating element. One example of an exhaust system for a truck, such as a diesel exhaust system, is shown below; however, other implementations are possible and contemplated.

Advantageously, a simplified circuit and method for providing power to the exhaust heating element are described. In conjunction with the simplified circuit, a variable-voltage signal may be output by the alternator provided to the heating element. Using various calculated feed-forward and feedback mechanisms, power delivery to the electric heating element may be highly accurate, may accommodate manufacturing and operating variances, and may compensate for loss or efficiency within the power delivery system.

In example embodiments, the controller may actuate a switch to modulate a field coil of an alternator in accordance with a wide variety of inputs. For example, the controller may modulate a signal at a field terminal of an alternator by actuating a switch in accordance with a determined duty cycle to induce current in a field coil of an alternator, thereby controlling power output from the alternator on a variable-voltage generator output line that is connected, for example directly connected, from the alternator to the heating element. Such an arrangement avoids use of costly circuit components that would otherwise be included on a constant-voltage supply line output from an alternator, and both simplifies and improves overall circuit operation for power delivery.

Figure 1:
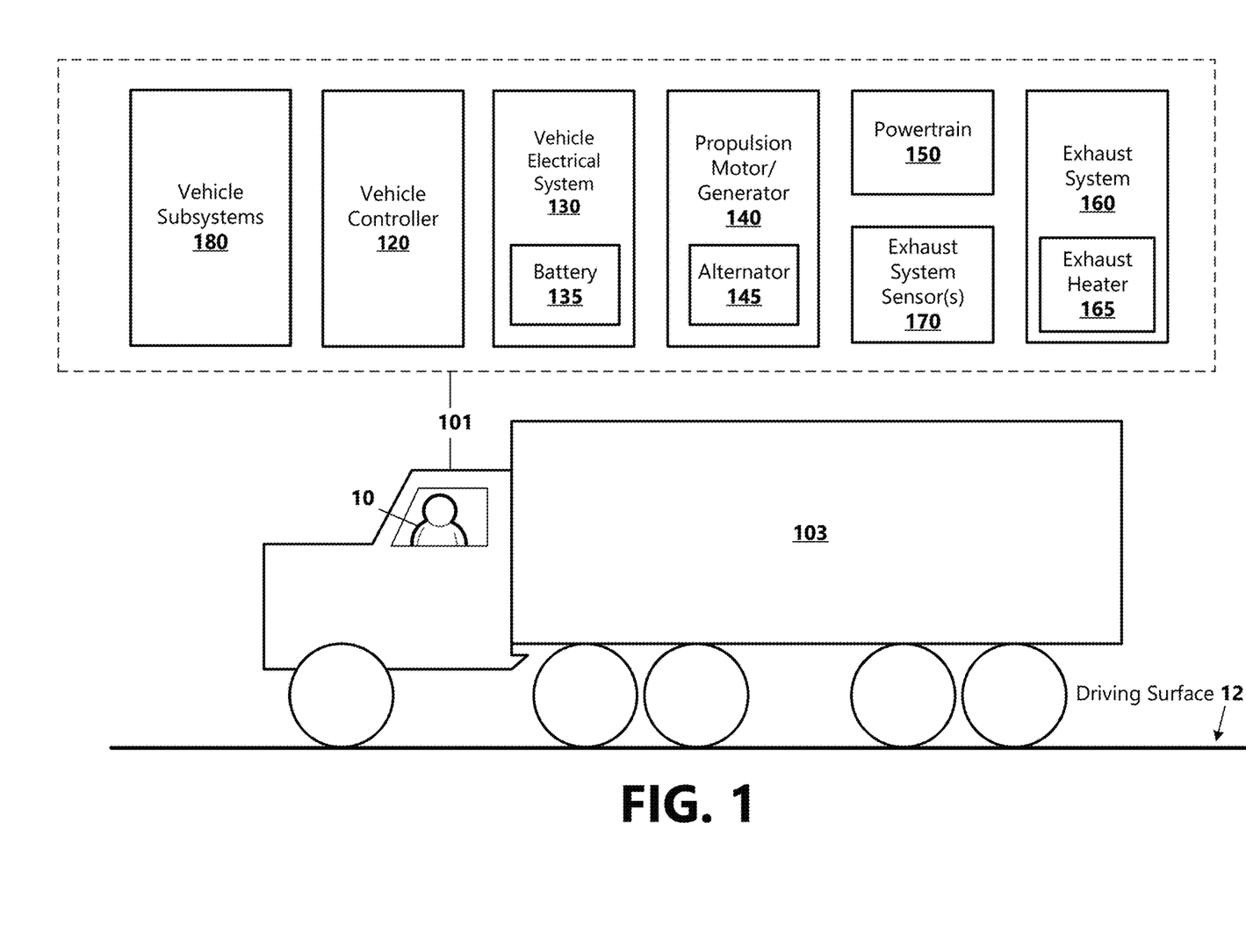
FIG. 1 illustrates an example vehicle environment in which aspects of the present disclosure can be implemented.

FIG. 1 is an illustration depicting a side view of a vehicle 101 implementing a system for alternator modulation for control of an electric heating element of a vehicle exhaust system, according to an example embodiment of the present disclosure. The vehicle 101 is one example of a type of vehicle that may be implement such control and power delivery processes described herein.

In some examples, the vehicle 101 may be a heavy-duty truck such as a part of a tractor-trailer combination. The vehicle 101 may have what is sometimes referred to as, a fifth wheel by which a box-like, flat-bed, or tanker semi-trailer 103 (among other examples). may be attached for transporting cargo or the like. While the vehicle 101 is depicted as a truck in FIG. 1, it should be appreciated that the present technology is applicable to any type of vehicle where automated throttle filtering may be desired.

In the example shown, the vehicle 101 may be operated by an operator 10, along a driving surface 12. The vehicle 101, in the example shown, includes, among other features, a vehicle controller 120, a vehicle electrical system 130, a motor/generator 140, which may include an alternator 145, a powertrain 150, and exhaust system 160, exhaust system sensors 170, and various other vehicle subsystems 180.

The vehicle controller 120 includes a programmable circuit, such as a computing device, which may be operable to control one or more subsystems of the vehicle 101. For example, the vehicle controller 120 may receive one or more sensor signals associated with the motor/generator 140, the powertrain 150, or exhaust system sensors 170, for actuating one or more subsystems in response to sensed conditions and/or user inputs. In some example embodiments, the vehicle controller 120 may include instructions for modulating an input signal to the motor/generator 140, and in particular to alternator 145, which may in turn deliver power to a heating element within the exhaust system 160, as discussed further below.

The vehicle electrical system 130 may include one or more batteries that are usable to power accessory subsystems within the vehicle 101, and may be integrated with the motor/generator 140 two provide electrical power to such subsystems.

The motor/generator 140 and associated powertrain 150 may operate to generate power and to convert the power into movement. For example, the motor/generator 140 may include a power source, such as an engine, as well as an alternator 145. The powertrain 150 may various components that operate to convert the engine's power into movement of the vehicle (e.g. the transmission, driveshafts, differential, and axles). The powertrain 150 may be one of various types of powertrains or hybrid powertrains; in particular examples, the powertrain comprises an internal combustion powertrain, such as diesel powertrain or hybrid diesel powertrain. In some examples, the powertrain 150 and motor/generator 140 include an engine, such as a diesel engine, which expels exhaust gases to the exhaust system 160.

The exhaust system 160 is operatively connected to the motor/generator 140 and powertrain 150, receiving expelled gases from a diesel engine, and providing various treatment operations prior to exhausting such gases. The various treatment operations may include sound dampening as well as exhaust gas treatment processes, such as catalyzing certain gases, such as NOx gases, which may be regulated in terms of the volume expelled. In the example shown, the exhaust system 160 includes a heating element, shown as exhaust heater 165. The exhaust heater 165 may be an electrically controlled heating element positioned along the exhaust system, such as seen in the example underbody aftertreatment system of FIG. 2, below, used to heat exhaust gases or a catalyst to neutralize exhaust gases.

In the example shown, the exhaust system sensors 170 may include a variety of sensors determining the status of an exhaust system, and may include current and/or voltage sensors associated with circuits providing electric power to the exhaust heater 165, and may also include sensors, such as temperature or gas sensors, within the exhaust system 160, to determine effectiveness of catalytic processes occurring within that exhaust system.

The vehicle 101 may include one or more other vehicle subsystems 180, such as accessory power systems, lighting systems, vehicle cabin temperature conditioning systems, communication systems, and various other types of equipment. Each of the other vehicle subsystems 180 may also be powered via the vehicle electrical system 130.

Figure 2:
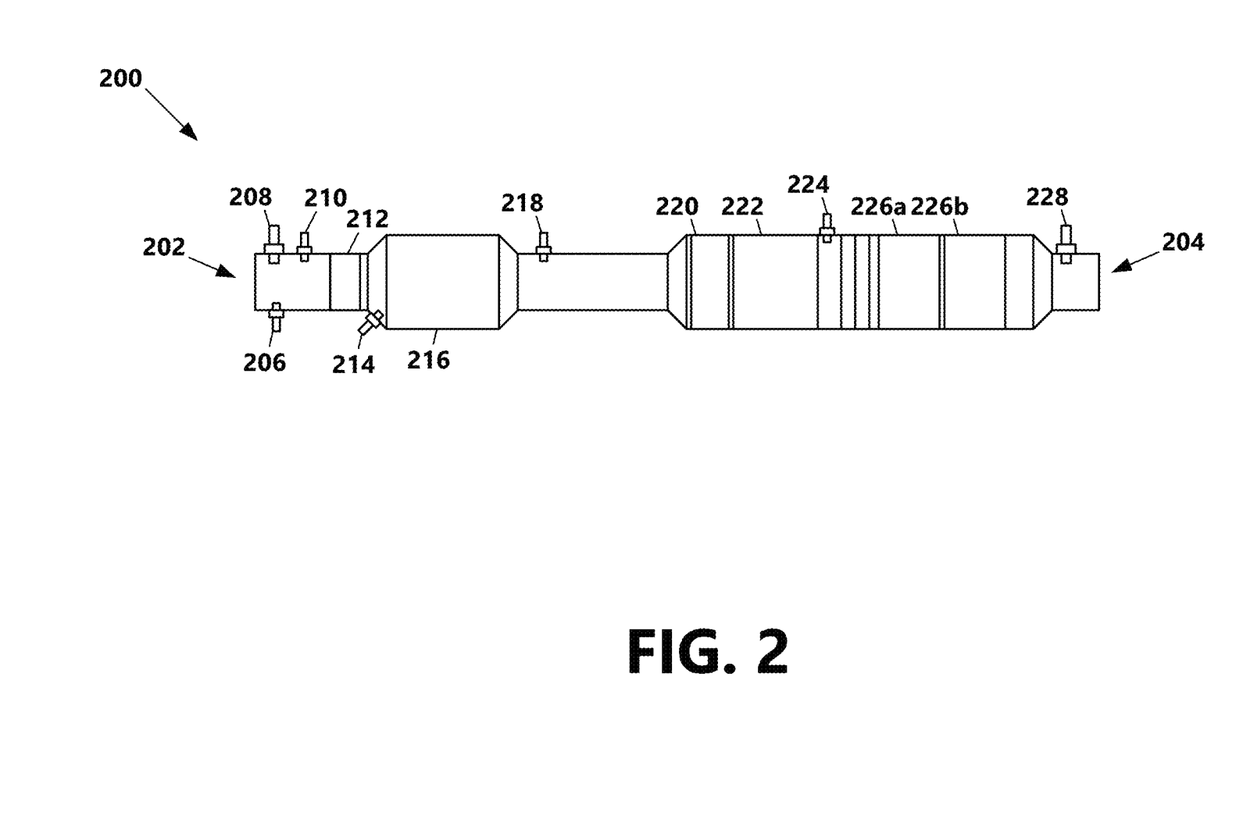
FIG. 2 illustrates an example close-coupled catalyst and underbody aftertreatment system that may be operable in accordance with aspects of the present disclosure.

FIG. 2 illustrates an example close-coupled catalyst and underbody aftertreatment system 200 that may be operable in accordance with aspects of the present disclosure. In examples, the underbody aftertreatment system 200 may be utilized within an exhaust system 160 of a vehicle, as seen in FIG. 1, above.

In the example shown, the underbody aftertreatment system 200 has an inlet end 202 and an outlet end 204. The inlet end 202 will be positioned and connected to a diesel engine, for example to receive engine exhaust. A conduit for exhaust gas extends between the inlet end 202 and the outlet end 204, and includes a variety of sensors and treatment systems positioned along a path between ends 202, 204 as described herein.

In the example shown, a thermocouple 206, a NOx sensor 208, and an exhaust fluid injector 210 may be positioned proximate the inlet end 202. The thermocouple 206 is positioned to determine a temperature of exhaust gas exiting the engine and entering the underbody aftertreatment system 200. The NOx sensor 208 is also positioned to detect NOx levels within exhaust gas exiting the engine and entering the underbody aftertreatment system 200. The exhaust fluid injector 210 is positioned to selectively inject small quantities of diesel exhaust fluid into the exhaust system upstream of a catalyst, where the diesel exhaust fluid may vaporize and decompose to form ammonia and carbon dioxide. The ammonia is used in conjunction with the catalyst to convert NOx to nitrogen and water, thereby reducing the levels of NOx exhausted by a vehicle.

In the example shown, a heating element 212 may be positioned immediately upstream along the exhaust path from a close-coupled catalyst 216. Additionally, a thermocouple 214 may be used in conjunction with the close coupled catalyst 216 to determine a temperature at which exhaust gases enter the catalyst region. The heating element 212 may be electrically connected to receive a voltage, as managed via a controller, in accordance with the methods and circuits described below, to cause the heating element 212 to raise a temperature of the exhaust gases and or close-coupled catalyst 216, to ensure an appropriate catalytic reaction between the close-coupled catalyst 216, the exhaust gases, and the diesel exhaust fluid. In some examples, the heating element 212 may comprise a resistive heating element, and as such may be referred to as an electric heating element herein.

Downstream of the close-coupled catalyst 216, a further NOx sensor 218 may be positioned along the exhaust path, for example to determine NOx levels of exhaust gases after the catalytic reaction at the close-coupled catalyst 216. An output of the NOx sensor 218 may be used to determine the effectiveness of the catalytic reaction, and may be used to adjust an amount of diesel exhaust fluid injected upstream of the close-coupled catalyst 216.

In the example shown, a diesel oxidation catalyst 220 may be positioned downstream of the close-coupled catalyst 216. Generally speaking, the diesel oxidation catalyst promotes chemical oxidation of carbon monoxide and gas phase hydrocarbons, for example to oxidize nitric oxide to nitrogen dioxide. A diesel particulate filter 222 may be positioned downstream of the diesel oxidation catalyst to 20, and may capture remaining diesel particulates passing through the exhaust path.

In the example shown, a further underbody exhaust fluid injector 224 may inject, at a second location downstream of the exhaust fluid injector 210, a further amount of exhaust fluid for use in a catalyzing reaction at one or more underbody catalyst regions 226a-b. An exhaust-end NOx sensor 228 may detect NOx levels at the outlet end 204 prior to emission.

Although the underbody aftertreatment system 200 as disclosed includes a particular set of sensors and catalysts, as well as order of fair positioning along an exhaust path, it is noted that a variety of alternative arrangements are possible as well. Furthermore, although the heating element 212 is shown as being included within the underbody aftertreatment system 200 upstream of the close-coupled catalyst 216, it is noted that the heating element 212 may be placed elsewhere along the exhaust path. For example, in some embodiments the heating element 212 may be positioned between the underbody exhaust fluid injector 224 and the underbody catalyst 226. Additionally, other heating elements (not shown) may be included at different locations along the exhaust path. The systems and methods described herein are usable with a heating element 212 positioned in a variety of locations, or with multiple such resistive heating elements.

Figure 3:
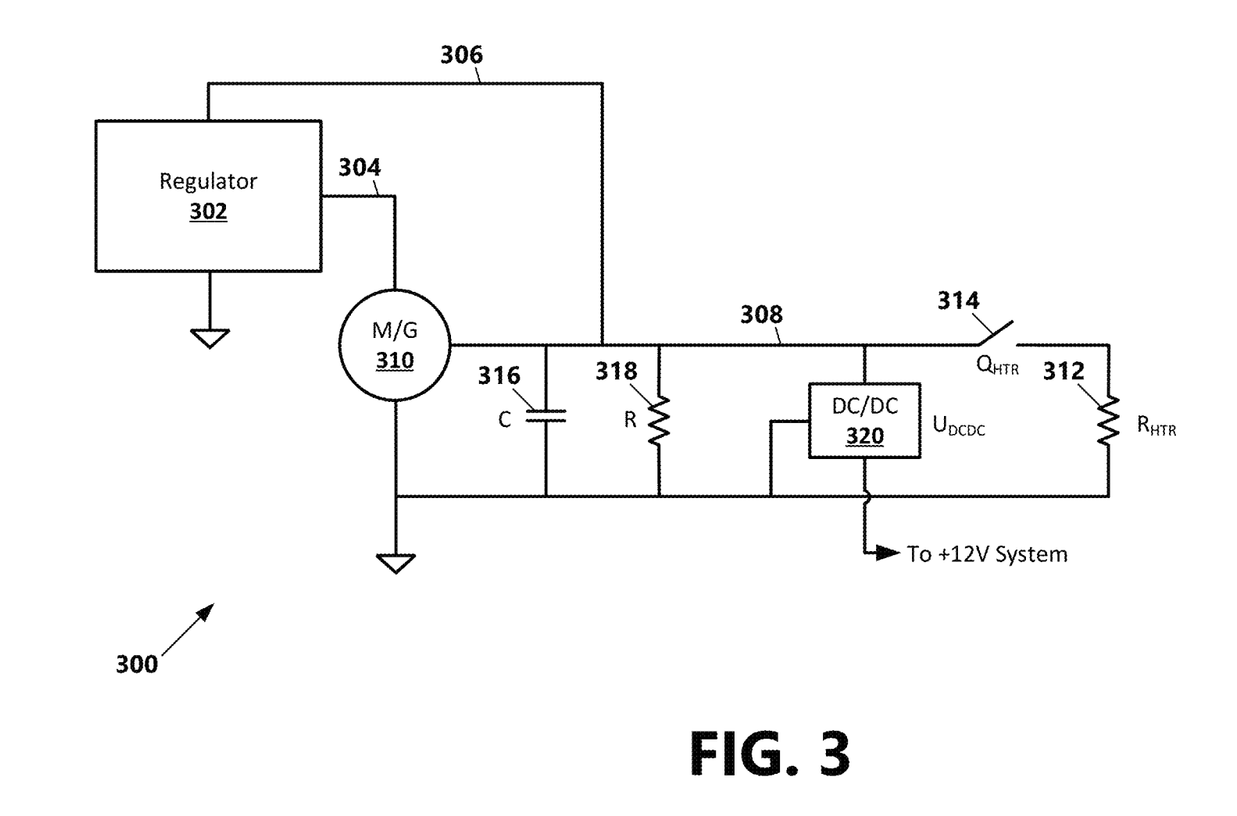
FIG. 3 illustrates a conventional implementation of a power delivery circuit for an exhaust heating element.

In example implementations, the heating element 212 may be a resistive heating element, and may have power demands that are greater than are able to be supplied by a conventional 12V charging system. Accordingly, especially so the exhaust system remains compliant with upcoming legislation, power levels delivered to the heating element 212 require use of the output of a motor/generator, which typically will be higher voltage and higher current. As illustrated in FIG. 3, a conventional implementation of a power delivery circuit 300 may be used in a vehicle to deliver power to an exhaust heating element. In the example shown, a regulator 302 is electrically connected to a field terminal of a motor/generator 310, for example via electrical connection 304. The motor/generator 310 can be implemented as, or including, an alternator, and outputs voltage on a DC voltage bus 308.

In the example shown, the regulator 302 receives feedback via an output line 306 to control a fixed-voltage output of the motor/generator 310 on the DC voltage bus 308. In example embodiments, the regulator 302 and motor/generator 310 are configured to maintain a +48V output voltage on the DC voltage bus 308.

An electric heating element 312 is positioned at an exhaust system of the vehicle, for example to heat exhaust gases and/or catalyst components within the exhaust system to activate the catalyst, thereby reducing NOx emission levels to within environmental requirements. To control the extent of heating at the electric heating element 312, a switch 314 may be actuated to selectively connect the DC voltage bus 308 to the electric heating element, thereby selectively applying the constant voltage to that electric heating element 312. In such cases, the switch may be implemented as an electrically-actuated switching element, such as a transistor, and may be controlled by a microcontroller (not shown). The switch 314 is modulated to a duty cycle that is directly proportional to power demand at the electric heating element 312.

In addition, within the circuit 300, a DC-DC converter 320 may also be electrically connected to the DC voltage bus 308, and may step down from the voltage at the DC voltage bus (e.g., +48V) to a lower DC voltage for use by other vehicle loads needing a lower DC voltage. For example, the DC-DC converter 320 may be configured to output a constant +12V DC voltage. Other voltage levels, and DC-DC converters, may be used as well. To help maintain a consistent voltage, a capacitor 316 may be electrically connected between the DC voltage bus 308 and chassis ground.

In the example shown, an additional resistive element 318 is shown, and represents additional loads (e.g., from the vehicle) that may draw from the DC voltage bus 308. The additional loads, as well as the DC-DC converter 320, may be, in this configuration, particularly adapted to receive a constant DC voltage signal.

Figure 4:
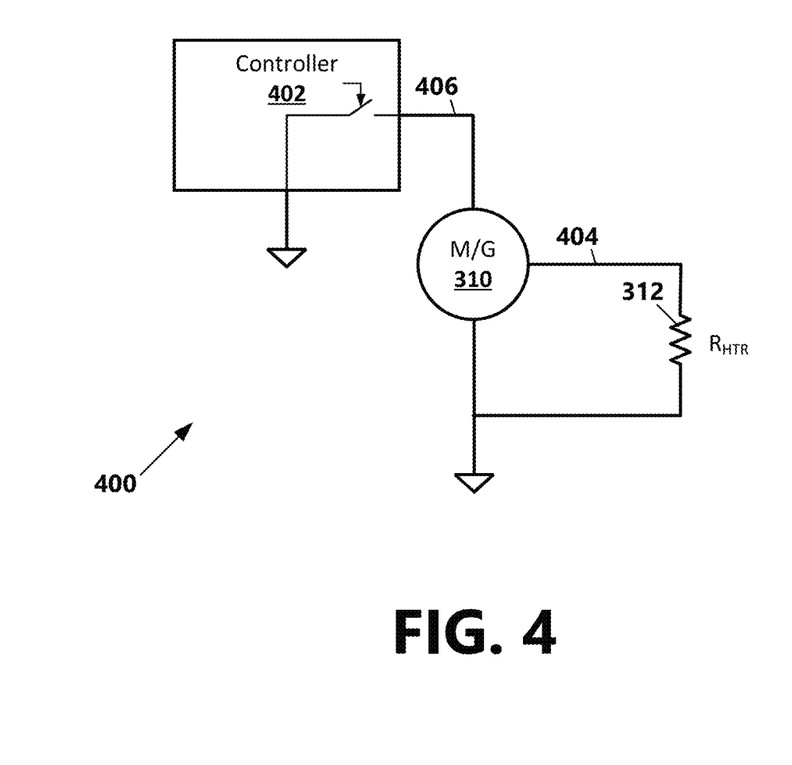
FIG. 4 illustrates an example implementation of a power delivery circuit in accordance with aspects of the present disclosure.

FIG. 4 illustrates an example power delivery circuit 400 that may be used to implement aspects of the present disclosure. In this example, a controller 402 is electrically connected to the field terminal of the motor/generator 310. In this construction, rather than using a constant voltage output on a DC voltage bus 308, the motor/generator 310 has a variable voltage output 404, which is modulated directly by the controller 402 via a control input 406 to the field terminal of an alternator included within the motor/generator 310. The controller 402 may calculate a power demand of an electric heating element 312 based on an amount of heat desired to be generated, and may accordingly modulate the input to the field terminal of the motor/generator 310.

In example implementations, the controller 402 selectively actuates a switching element, such as an electrical switch (e.g. a MOSFET), which is electrically connected between the field terminal at control input 406 and chassis ground. The controller 402 may specifically modulate the field coil by applying a pulse width modulation (PWM) scheme at the field coil of an alternator of the motor/generator 310 to achieve a desired power level at the electric heating element 312. In some implementations, the controller 402 may receive feedback as to the actual power delivered to the electric heating element 312, or as to the amount of heat actually generated, to adjust the power delivered.

In example implementations, the controller 402 may be a separate control circuit maintained within a vehicle control infrastructure. In other implementations, the controller 402 may be implemented such that an electrical switch is controlled directly from a vehicle's engine control unit (ECU).

Although in this implementation, total harmonic distortion or ripple may be higher as compared to in the constant DC voltage implementation described above in conjunction with FIG. 3, suppression of harmonic distortion is not important to the heating element 312, which operates as a simple resistor. Accordingly, a more expensive, high-voltage switching element, such as switch 314 and associated ripple mitigation circuitry and capacitive elements, may be avoided. In particular, because distortion is acceptable, a less expensive switching element, such as a low cost FET/transistor may be utilized.

Notably, the power delivery circuit 400 may be implemented in parallel with, and separate from but overlaid onto an existing vehicle charging system. Furthermore, the power delivery circuit 400 does not require a constant output voltage at the voltage output 404 delivered to the electric heating element 312, and reduces the need for large capacitors and other voltage stabilization circuit elements that would otherwise be required in a power delivery circuit such as that seen above in conjunction with FIG. 3. Still further, the power delivery circuit 400 does not require a separate, external voltage source higher than the 12V source typically included in vehicle electrical systems, but instead relies on output of the alternator to achieve appropriate power delivery levels.

Figure 5:
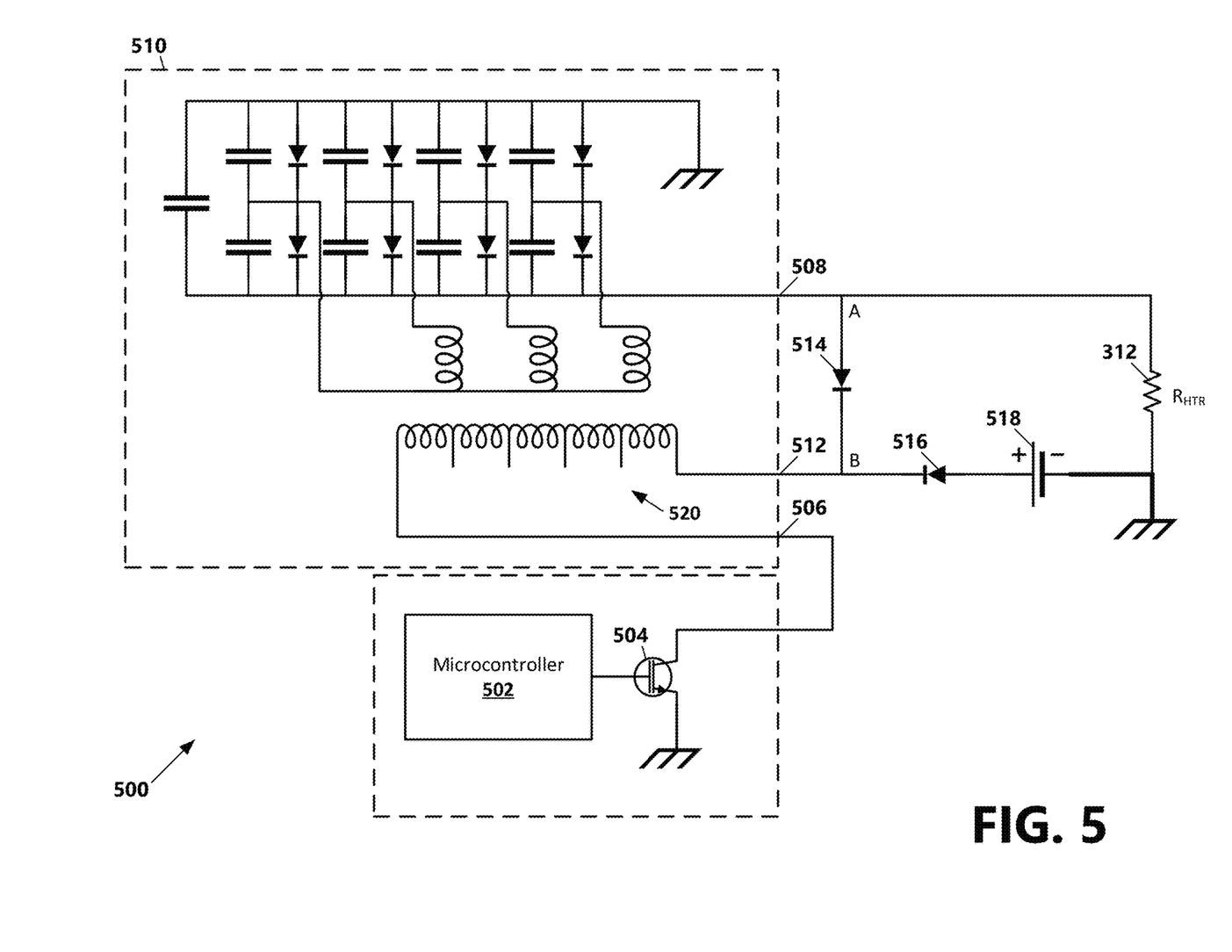
FIG. 5 illustrates an example detailed circuit diagram of a power delivery circuit in accordance with aspects of the present disclosure.

FIG. 5 illustrates an example detailed circuit diagram of a power delivery circuit 500 in accordance with aspects of the present disclosure. The example detailed power delivery circuit 500 represents one possible implementation of a power delivery circuit consistent with the principles described above in conjunction with FIG. 4.

In the example shown, the power delivery circuit 500 includes a microcontroller 502 that controls a switch 504, such as a MOSFET or other transistor-based switching element. The switch 504 is electrically connected between a first field terminal 506 of an alternator 510 and a chassis ground.

In the example shown, a generator output terminal 508 provides an output voltage from the alternator 510. The generator output terminal 508 outputs a variable voltage signal in accordance with the manner in which the alternator 510 operates, as discussed further below. The generator output terminal 508 is electrically connected to an electric heating element 312, which is also connected to chassis ground. Accordingly, a voltage from the generator output terminal 508 is delivered to the electric heating element 312, for use in heating exhaust gases of a vehicle exhaust system as described above.

In the example shown, the alternator 510 may be a multi-phase alternator, one phase of which is shown. A field section 520 of the alternator 510 may be used to induce current within each phase of the alternator, for example to initialize operation of the alternator at the time a vehicle motor/generator is started.

In the example power delivery circuit 500 as illustrated, a diode 514 is connected between the generator output terminal 508 and a second field terminal 512. Additionally, a voltage source 518 and diode 516 are electrically connected between the second field terminal 508 and a chassis ground.

The diodes 514, 516 operate as OR-ing diodes, thereby providing to the second field terminal 512 the higher voltage of the two voltages between (1) the voltage at the generator output terminal 508, and (2) the voltage output by the voltage source 518. The voltage source 518 generally corresponds to an initialization voltage source, such as a +12V source.

In operation, the second field terminal 512 is initially provided an initialization voltage from voltage source 518. To induce current in the field section 520 of the alternator 510, the microcontroller 502 may selectively actuate switch 504, thereby causing current to flow through the coils of the field section. A current will subsequently be induced in coils of respective phases of the alternator 510, resulting in an output voltage appearing at the generator output terminal 508. Once engine speeds cause the rotor shaft of the alternator to spin at an adequate speed to produce sufficient power, the voltage at the generator output terminal 508, and consequently at the second field terminal 512, can be increased beyond the initialization voltage to a peak output voltage (e.g., in examples, up to +48V). By adjusting a current that passes through the field coil in the field section 520, the microcontroller 502 can control the voltage at the generator output terminal 508 in such a manner. Specifically, by actuating the switch 504 to connect the first field terminal 506 to the chassis ground, the microcontroller can induce a current through the field coil in the field section 520, thereby causing voltage output at the generator output terminal 508. By applying a pulse width modulation scheme at the switch 504, the microcontroller 502 ultimately controls power delivered to the electric heating element 312.

In the example shown, the microcontroller 502 may select a duty cycle for pulse width modulation of the switch 504 based on a selected target power level and feedback power delivered to the electric heating element 312. In particular, the microcontroller 502 may utilize feedforward maps constructed to map a particular feed-forward duty cycle to a particular power demand of the heater, based on characteristics of the heater and alternator. For example, a feedforward duty cycle may be determined by power demand and feedback from the electric heating element in accordance with the following equations:

$$R_{heater} = \frac{V_{heater}}{I_{heater}} \qquad (1)$$

$$FF\ DC\% = 100 \times \sqrt{\frac{P_{demand}}{R_{heater}} \times \frac{R_{heater}}{V_{alternator}}} \qquad (2)$$

In the above, Rheater corresponds to a resistance of the heating element, Vheater corresponds to a voltage at the positive terminal of the heating element relative to ground, and Iheater corresponds to a current through the heating element 312, respectively. In examples, the microcontroller 502 may determine a duty cycle, and use that duty cycle to modulate the field terminal 506 to meet power demand. While in the above a mapped response of the heater to a delivered voltage is used in feed-forward maps stored in memory that correlate the duty cycle to output power, the microcontroller may alternatively use other sensed conditions utilize current engine speed, engine coolant temperature, or various other metrics for calculated power output.

In addition to, or in place of, static, feed-forward maps that correlate predetermined duty cycle values to target power output levels, a variety of feedback processes may be applied to more accurately tie the determined duty cycle of switching the switch 504 at the microcontroller to power output.

Figure 6:
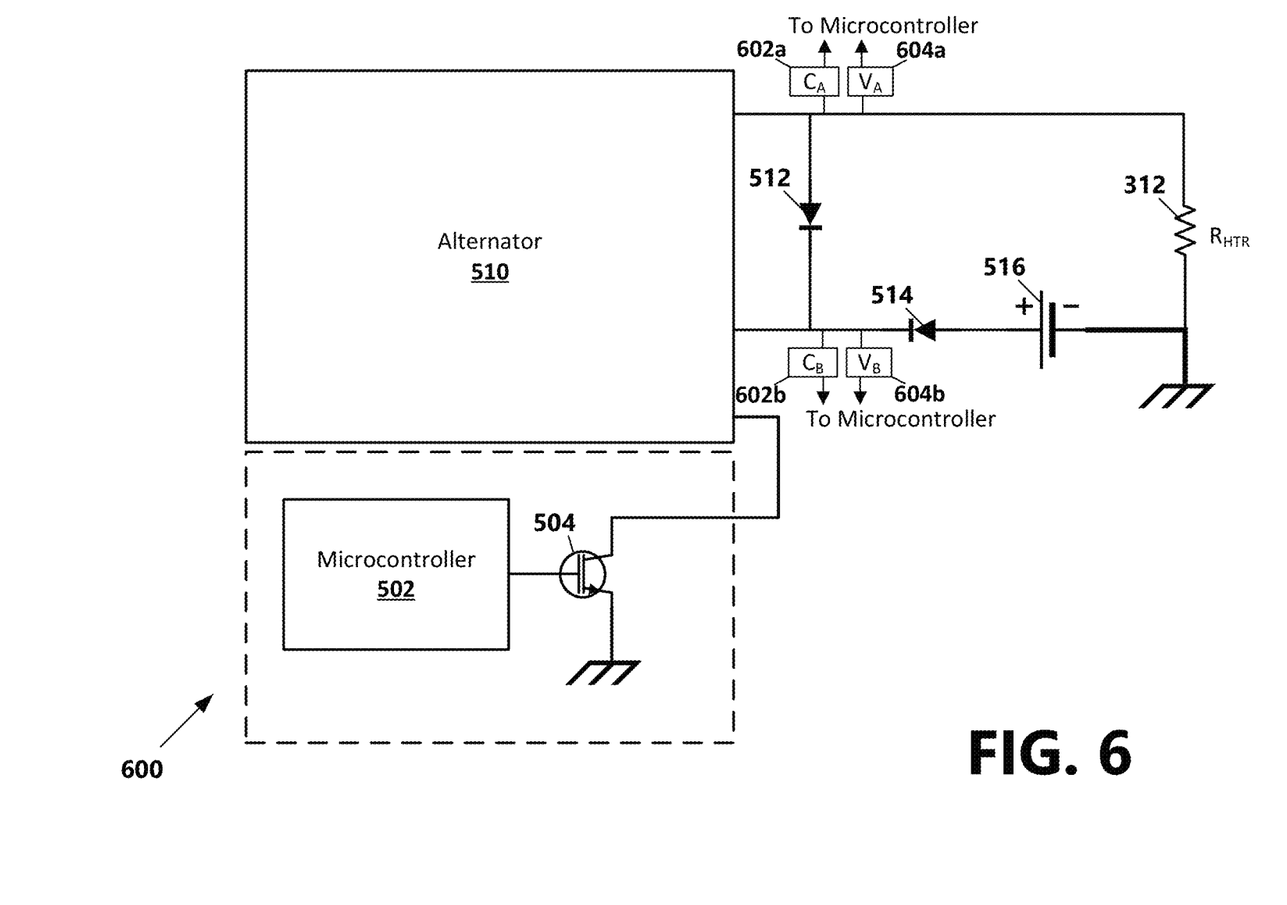
FIG. 6 illustrates a variation on the power delivery circuit of FIG. 5, in accordance with aspects of the present disclosure.

FIG. 6 illustrates a further power delivery circuit 600, in accordance with the power delivery circuit of FIG. 5, in accordance with aspects of the present disclosure. In the example power delivery circuit 600, additional sensing elements are provided within the circuit to allow for feedback-based duty cycle determinations at the microcontroller 502. In particular, a voltage sensor 602a and a current sensor 604a are positioned at the generator output terminal 508, and a second voltage sensor 602b and second current sensor 604b are positioned at the second field terminal 512. By monitoring current and voltage at the generator output terminal 508 and second field terminal, feedback-based control may be implemented to directly drive the electric heating element 312. In particular, an output of the current and voltage sensors 602a-b, 604a0b may be fed back to the microcontroller 502, which may calculate the power demand for the electric heating element (Pdemand) as follows:

$$Pdemand = \frac{Qdemand}{dt} = \tag{3}$$

$$Qtarget + \max\left(Qstart - \int \left(\dot{m} \times C_p \times T_{exh_{fb}} + P_{add}\right), 0\right) - Q_{engine} - Q_{loss}$$

In the above calculation of power demand, the following definitions may be used:

$Q_{demand}$ is a thermal energy demanded value, in kilowatts, and represents total heat delivery.

$Q_{target}$ represents a thermal energy target value, in kilowatts, and is defined as a moving average window (MAW) over a series of samples taken over time to arrive at a desired temperature, as follows:

$$Qtarget = MAW(i, i-A)(m \times C_p \times T_{exh_{des}}/t)dt \tag{4}$$

In this example, the moving average window may be a predetermined number of samples taken periodically, for example per second over a 10-30 second window. In some examples, $Q_{target}$ may be selected such that an exhaust temperature is 275 degrees Celsius (i.e., at $T_{exh_{des}}$ as noted below).

$Q_{start}$ is a thermal energy required to reach a target mid-bed SCR temperature, in kiloJoules.

$Q_{loss}$ represents heat losses through the exhaust system, and is based, at least in part, on vehicle speed (to accommodate convective effects of wind) and ambient temperature during vehicle operation. $Q_{loss}$ may be directly calculated, or may be derived from a lookup table based on a range of typical operating vehicle speeds and ambient temperatures, which may be initialized and stored in memory of the vehicle.

$Q_{engine}$ is a thermal energy actual value, in kilowatts, and is defined as a moving average window over a series of samples taken over time that is used to arrive at the actual temperature, as follows:

$$Q_{engine} = MAW(i, i-A)(m \times C_p \times T_{exh_{fb}}/t)dt \tag{5}$$

As above, the moving average window may be a predetermined number of samples taken periodically, for example per second over a 10-30 second window.

$P_{add}$ is an instantaneous power delivered by the heating element.

$Texh_{des}$ is a desired exhaust temperature from the engine, in degrees Celsius. In some examples, this may be set at about 275 degrees Celsius.

$Texh_{fb}$ is a feedback exhaust temperature from the engine, in degrees Celsius.

$Q_{add}$ is an optional term and represents thermal energy added from an optional, added heating element, in kiloJoules.

Using the above calculations for Pdemand, a more specific power demand may be calculated, and therefore power demand may be adjusted based on feedback from voltage and current sensors. Additionally, feedback may be provided from temperature sensors at desired locations within the exhaust system, for example at thermocouples 206, 214 of the exhaust system described above.

It is noted that, because the feedback-based systems compare actual power delivery to desired power delivery, the application of feedback-based duty cycle determinations at the microprocessor may be particularly advantageous to compensate for production tolerances of any of the related parts which may have performance that changes with age. This can improve long-term power demand tracking, as the components within the exhaust system age, and use of feed-forward maps alone would gradually lose accuracy. Additionally, modulation of the field current may be compensated for as the output voltage of the generator rises, since power output is nonlinear in nature and maximum power output of the alternator can vary according to the rate at which the alternator shaft is turning, in addition to how much current is passing through the field coil. Overall, combinations of feed-forward maps, feedback systems, or combinations thereof may be employed to ensure accurate power delivery and compliance with environmental regulations by ensuring proper catalyst operations in a vehicle exhaust system.

Figure 7:
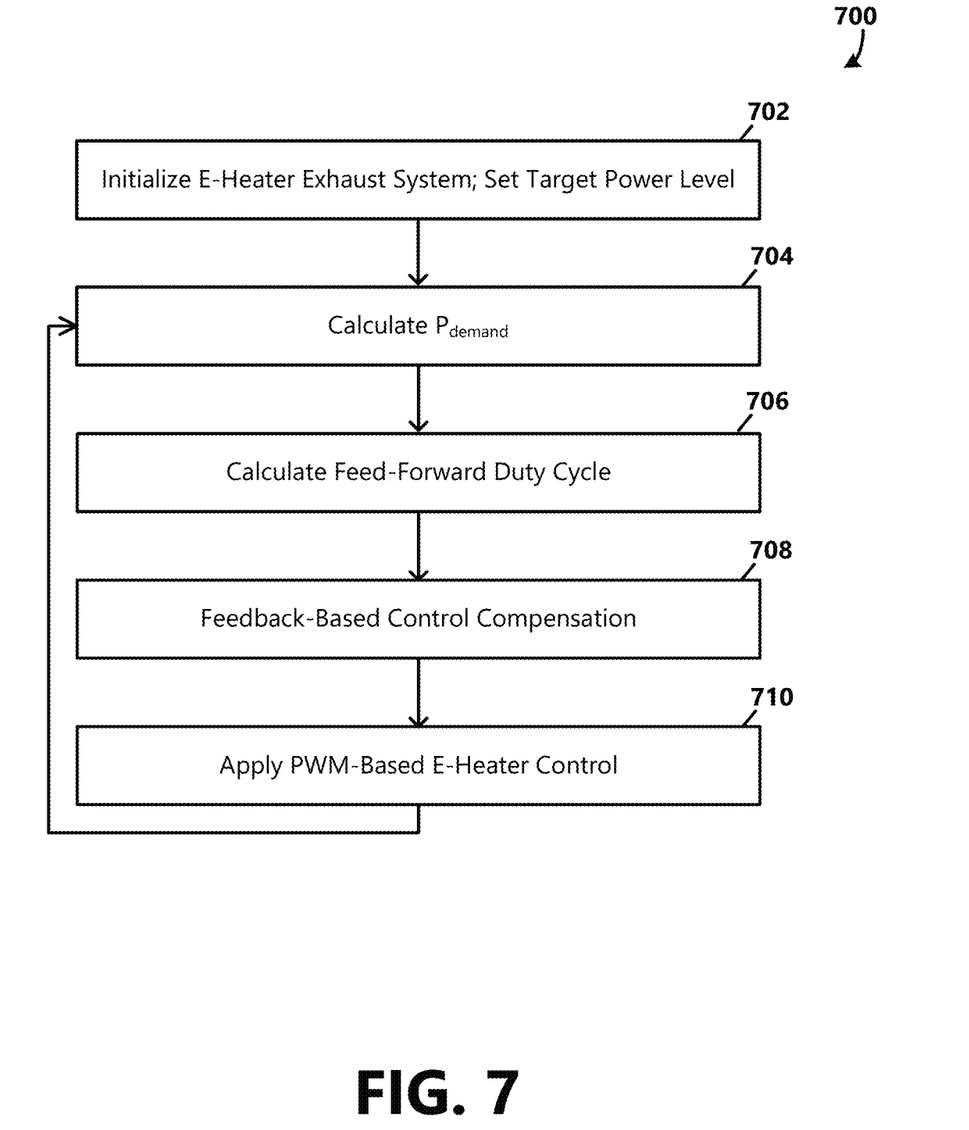
FIG. 7 is a flowchart of an example method of controlling power delivery to an exhaust heating element, in accordance with aspects of the present disclosure.

Referring now to FIG. 7, a flowchart of an example method 700 of controlling power delivery to an electric heating element of a vehicle exhaust system, in accordance with aspects of the present disclosure. The example method 700 may be performed using the power delivery circuits described herein, with all or a portion of the method 700 being performed by a controller, such as controllers 402, 502 of FIGS. 4-6, as may be implemented as discrete control circuits and/or within an engine control unit (ECU).

In the example shown, the method 700 is instantiated by initializing an electric heating element of an exhaust system (at step 702). Initializing an electric heating element of the exhaust system may include, for example, applying an initialization voltage to a field terminal of an alternator, such as by using a +12V voltage supply as the voltage supply 518 described above in conjunction with FIGS. 5-6. Use of such a voltage supply may result in a voltage of greater than +11V being applied at the second field terminal 512 of an alternator 510, due to some voltage drop over diode 516. Initializing the overall exhaust system may also include initializing one or more calculation values for feedback or feed-forward power delivery calculations used to set a duty cycle for actuating a switch, thereby modulating the field terminal of the alternator. The initialized calculation values may include, for example, feed-forward duty cycle and power delivery values, or initial sensor values used in a feedback-based power delivery calculation.

The method 700 includes calculating a power demand of the electric heating element to achieve a desired temperature of the electric heating element (step 704). Calculating the power demand can include simply selecting a power delivery level for use in determining an appropriate duty cycle value from a feed-forward map of power delivery values. In alternative examples, calculating the power demand can include, for example, performing a mathematical calculation of power demand based on feedback regarding current temperature at a portion of the exhaust system (e.g., at a thermocouple of the exhaust system as described above).

In some example embodiments, the method 700 optionally includes, determining a feed-forward duty cycle for operation of a switch via a controller (e.g., switches seen in FIGS. 4-6, above) (step 706). The feed-forward duty cycle can be calculated using the equation (2) above, or can be determined from pre-calculated values, by looking up a duty cycle based on a desired target power delivery level of the alternator to the electric heating element.

In some further example embodiments, the method 700 optionally includes setting, or adjusting, a duty cycle for operation based on feedback from one or more sensors (step 708). The feedback from one or more sensors may include: feedback from engine speed sensors, a temperature from a temperature sensor in the exhaust system (e.g., thermocouples 206, 216), current and/or voltage levels obtained from current and voltage sensors 602a-b, 604a-b, and various other sensors.

The method further includes applying PWM-based modulation to a field terminal of an alternator to modulate power output from a generator output terminal of an alternator (step 710). The PWM-based modulation involves actuating a switch in accordance with the determined duty cycle to establish, for that duty cycle, a current at a field terminal of the alternator (e.g., across terminals 506, 512, or more generally at a field terminal 406) to control the alternator to deliver power to the electric heating element at an appropriate power delivery level.

As operation of the method 700 continues, one or more of the steps 704-710 may be repeated, for example on a continual, periodic, or as-required basis to adjust a power output of the alternator delivered to the electric heating element. Additionally, although the steps are described in a particular order, it is noted that the controller may perform steps 704-710 in different orders, for example calculating feedback-based duty cycle before determining the feed-forward duty cycle, or without use of feed-forward duty cycle mappings at all. Furthermore, in some examples, the feedback-based adjustment of the duty cycle may be excluded.

Figure 8:
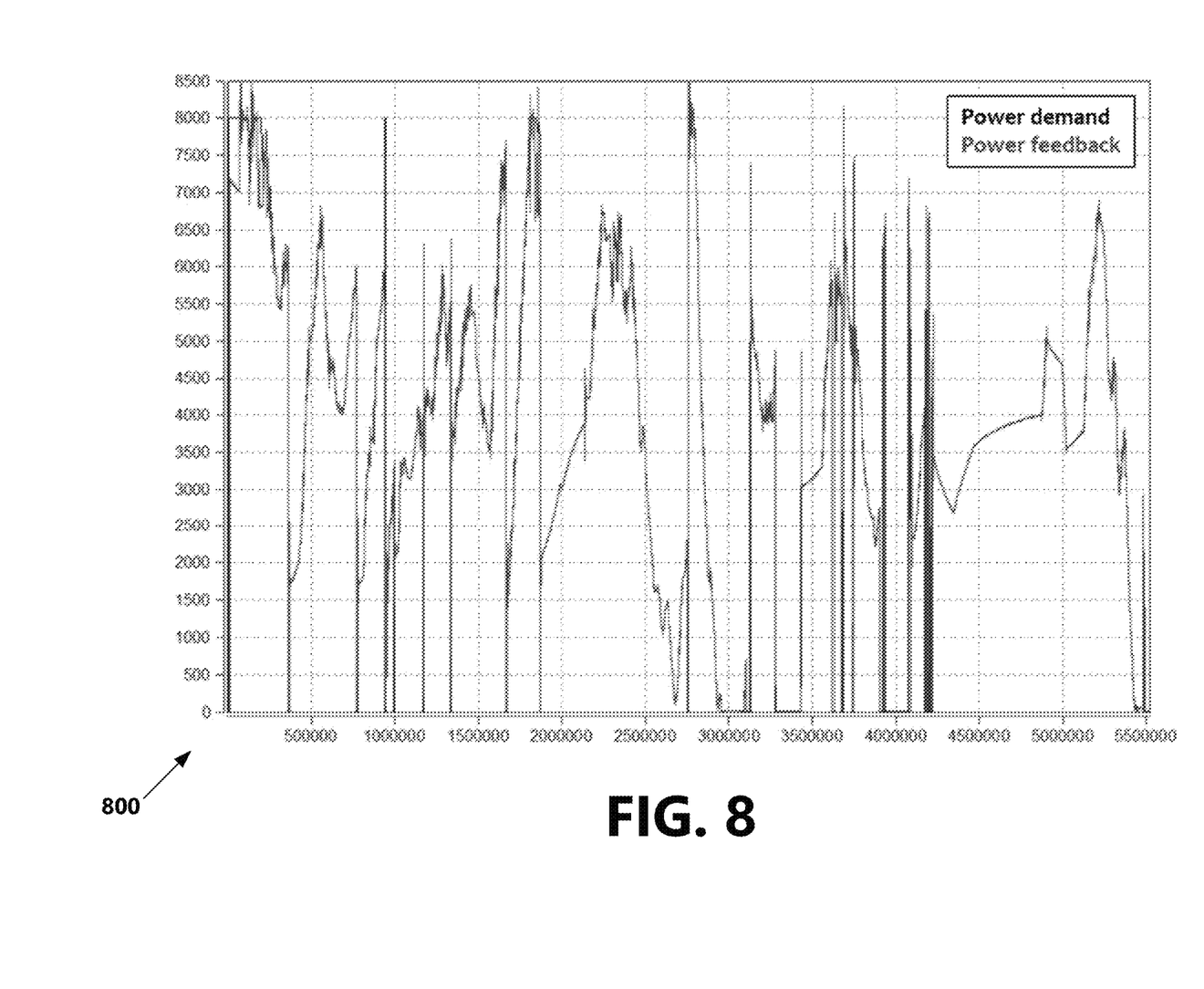
FIG. 8 is a chart illustrating a comparison between calculated power demand and actual power delivered using the power delivery circuits and control methods described herein.

FIG. 8 is a chart 800 illustrating a comparison between calculated power demand and actual power delivered using the power delivery circuits and control methods described herein. The chart 800 illustrates correspondence between the determined power demand and output for an electric heating element in accordance with aspects of the present disclosure. As can be seen in the example, a power demand in watts, calculated by the controller, over recorded time tracks closely to the actual power output at the electric heating element, as detected at a feedback circuit obtained from voltage and current readings at sensors such as those described above in conjunction with FIG. 6. In particular, through use of both feedforward and feedback control, it is possible for a controller to closely match desired power output to an electric heating element of an exhaust system of a vehicle, and thereby comply with applicable exhaust system regulations while implementing a simpler, lower cost solution providing at least the same accuracy as in existing exhaust systems.

Figure 9:
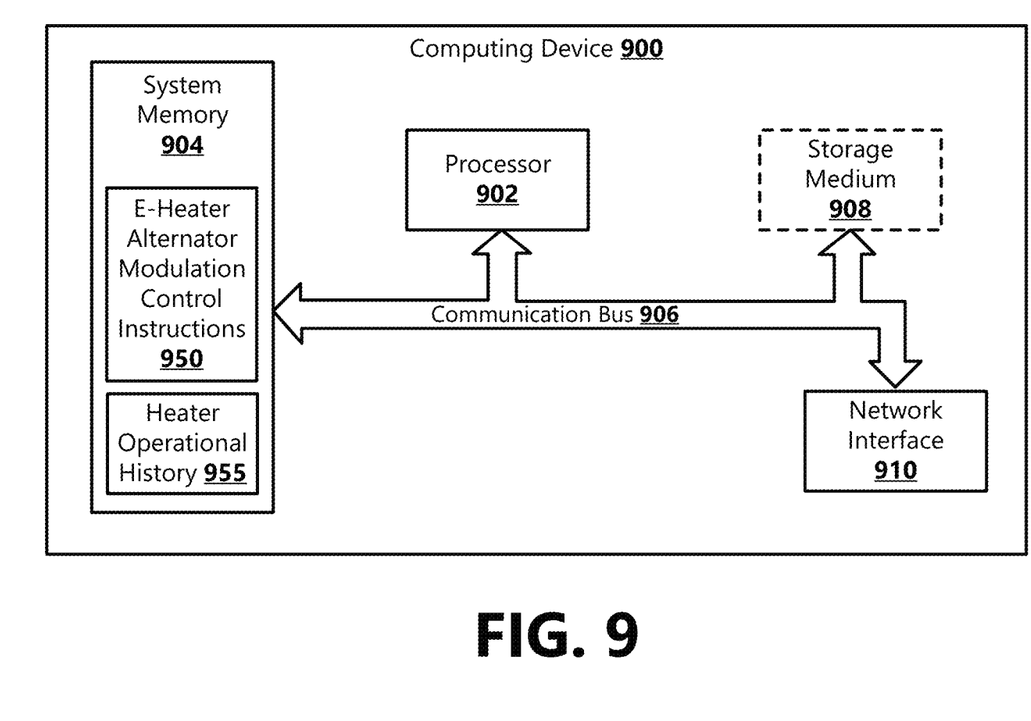
FIG. 9 is a block diagram of a computing device appropriate for use within the vehicle environment described herein to implement embodiments of the present disclosure.

FIG. 9 is a block diagram of an illustrative computing device 900 appropriate for use in accordance with embodiments of the present disclosure. For example, the computing device 900 may be used to implement the controller described above (which, in some implementations, may comprise the engine control unit of the vehicle). The description below is applicable to servers, personal computers, mobile phones, smart phones, tablet computers, embedded computing devices, and other currently available or yet-to-be-developed devices that may be used in accordance with embodiments of the present disclosure.

In its most basic configuration, the computing device 900 includes at least one processor 902 and a system memory 904 connected by a communication bus 906. Depending on the exact configuration and type of device, the system memory 904 may be volatile or nonvolatile memory, such as read-only memory ("ROM"), random access memory ("RAM"), EEPROM, flash memory, or other memory technology. Those of ordinary skill in the art and others will recognize that system memory 904 typically stores data or program modules that are immediately accessible to or currently being operated on by the processor 902. In some examples, system memory 904 may store an application 950 to perform elements of the present systems and methods, such as the alternator modulation control for an electric heating element as described herein. In this regard, the processor 902 may serve as a computational center of the computing device 900 by supporting the execution of instructions. Additionally, system memory 904 may store operational data 955, for example data collected from temperature sensors, voltage sensors, and current sensors associated with a vehicle exhaust system, and/or vehicle operational data from other sensors as noted above to assist with feedback-based adjustment of calculations of power demand at an electric heating element.

As further illustrated in FIG. 9, the computing device 900 may include a network interface 910 comprising one or more components for communicating with other devices over a network. Embodiments of the present disclosure may access basic services that utilize the network interface 910 to perform communications using common network protocols. The network interface 910 may also include a wireless network interface configured to communicate via one or more wireless communication protocols, such as WiFi, 2G, 3G, 4G, LTE, WiMAX, Bluetooth, or the like.

In the illustrative embodiment depicted in FIG. 9, the computing device 900 also includes a storage medium 908. However, services may be accessed using a computing device that does not include means for persisting data to a local storage medium. Therefore, the storage medium 908 depicted in FIG. 9 is optional. In any event, the storage medium 908 may be volatile or nonvolatile, removable or non-removable, implemented using any technology capable of storing information such as, but not limited to, a hard drive, solid state drive, CD-ROM, DVD, or other disk storage, magnetic tape, magnetic disk storage, or the like.

As used herein, the term "computer-readable medium" includes volatile and nonvolatile and removable and non-removable media implemented in any method or technology capable of storing information, such as computer-readable instructions, data structures, program modules, or other data. In this regard, the system memory 904 and storage medium 908 depicted in FIG. 9 are examples of computer-readable media.

For ease of illustration and because it is not important for an understanding of the claimed subject matter, FIG. 9 does not show some of the typical components of many computing devices. In this regard, the computing device 900 may include input devices, such as a keyboard, keypad, mouse, trackball, microphone, video camera, touchpad, touchscreen, electronic pen, stylus, or the like. Such input devices may be coupled to the computing device 900 by wired or wireless connections including RF, infrared, serial, parallel, Bluetooth, USB, or other suitable connection protocols using wireless or physical connections.

In any of the described examples, data can be captured by input devices and transmitted or stored for future processing. The processing may include encoding data streams, which can be subsequently decoded for presentation by output devices. Media data can be captured by multimedia input devices and stored by saving media data streams as files on a computer-readable storage medium (e.g., in memory or persistent storage on a client device, server, administrator device, or some other device). Input devices can be separate from and communicatively coupled to computing device 900 (e.g., a client device), or can be integral components of the computing device 900. In some embodiments, multiple input devices may be combined into a single, multifunction input device (e.g., a video camera with an integrated microphone). The computing device 900 may also include output devices such as a display, speakers, printer, etc. The output devices may include video output devices such as a display or touchscreen. The output devices also may include audio output devices such as external speakers or earphones. The output devices can be separate from and communicatively coupled to the computing device 900, or can be integral components of the computing device 900. Input functionality and output functionality may be integrated into the same input/output device (e.g., a touchscreen). Any suitable input device, output device, or combined input/output device either currently known or developed in the future may be used with described systems.

In general, functionality of computing devices described herein may be implemented in computing logic embodied in hardware or software instructions, which can be written in a programming language, such as C, C++, COBOL, JAVA™, PHP, Perl, HTML, CSS, JavaScript, VBScript, ASPX, Microsoft .NET™ languages such as C #, or the like. Computing logic may be compiled into executable programs or written in interpreted programming languages. Generally, functionality described herein can be implemented as logic modules that can be duplicated to provide greater processing capability, merged with other modules, or divided into sub-modules. The computing logic can be stored in any type of computer-readable medium (e.g., a non-transitory medium such as a memory or storage medium) or computer storage device and be stored on and executed by one or more general-purpose or special-purpose processors, thus creating a special-purpose computing device configured to provide functionality described herein.

Many alternatives to the systems and devices described herein are possible. For example, individual modules or subsystems can be separated into additional modules or subsystems or combined into fewer modules or subsystems. As another example, modules or subsystems can be omitted or supplemented with other modules or subsystems. As another example, functions that are indicated as being performed by a particular device, module, or subsystem may instead be performed by one or more other devices, modules, or subsystems. Although some examples in the present disclosure include descriptions of devices comprising specific hardware components in specific arrangements, techniques and tools described herein can be modified to accommodate different hardware components, combinations, or arrangements. Further, although some examples in the present disclosure include descriptions of specific usage scenarios, techniques and tools described herein can be modified to accommodate different usage scenarios. Functionality that is described as being implemented in software can instead be implemented in hardware, or vice versa.

Many alternatives to the techniques described herein are possible. For example, processing stages in the various techniques can be separated into additional stages or combined into fewer stages. As another example, processing stages in the various techniques can be omitted or supplemented with other techniques or processing stages. As another example, processing stages that are described as occurring in a particular order can instead occur in a different order. As another example, processing stages that are described as being performed in a series of steps may instead be handled in a parallel fashion, with multiple modules or software processes concurrently handling one or more of the illustrated processing stages. As another example, processing stages that are indicated as being performed by a particular device or module may instead be performed by one or more other devices or modules.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the claimed subject matter.

The invention claimed is:

1. A system for modulating power provided to an electric heating element of a vehicle exhaust system, the system comprising:
   a controller controlling a switch;
   an alternator having a first field terminal input, wherein the first field terminal input is connected to the switch; and
   an electric heating element connected to at least an output of the alternator;
   wherein the controller is configured to determine a power demand for the electric heating element and modulate the first field terminal input by actuating the switch in accordance with a duty cycle determined based on the power demand to cause the alternator to provide power to the electric heating element according to the power demand.

2. The system of claim 1, wherein the vehicle exhaust system comprises a diesel aftertreatment system extending a length between an inlet and an outlet, the inlet being upstream of the outlet, and wherein the electric heating element is positioned toward the inlet from one or more catalysts included along the length.

3. The system of claim 1, wherein the electric heating element is electrically connected between a generator output terminal and a chassis ground.

4. The system of claim 3, wherein the generator output terminal is directly connected to the electric heating element.

5. The system of claim 3, further comprising:
a voltage source electrically connected between the chassis ground and a second field terminal input to the alternator;
a first diode electrically connected between the generator output terminal and the second field terminal input; and
a second diode electrically connected between the voltage source and the second field terminal input.

6. The system of claim 5, further comprising:
a first sensor electrically connected at the generator output terminal; and
a second sensor electrically connected at the second field terminal input.

7. The system of claim 6, wherein the first sensor includes a first voltage sensor and a first current sensor, and the second sensor includes a second voltage sensor and a second current sensor.

8. The system of claim 1, wherein the duty cycle is calculated in accordance with the following equation:

$$FF\ DC\% = 100 \times \sqrt{\frac{Pdemand}{Rheater} \times \frac{Rheater}{Valternator}}$$

wherein Pdemand corresponds to the power demand for the electric heating element calculated by the controller, Rheater corresponds to a resistance of the electric heating element, and Valternator corresponds to a voltage output at the generator output terminal.

9. The system of claim 1, further comprising a sensor at the electric heating element, the sensor providing feedback to the controller regarding an exhaust system temperature in response to the power provided to the electric heating element from the alternator.

10. The system of claim 9, wherein the controller is further configured to adjust modulation of the first field terminal input in accordance with the feedback.

11. A method of delivering power to an electric heating element of a vehicle exhaust system, the method comprising:
initializing a voltage output at a generator output terminal of an alternator with an initial input voltage;
determining, at a controller, a power demand for an electric heating element, the electric heating element being electrically connected to the generator output terminal; and
actuating, by the controller, a switch that is electrically connected to a first field terminal of the alternator in accordance with a duty cycle determined based on the power demand to modulate power output from the alternator at the generator output terminal and delivered to the electric heating element in accordance with the power demand.

12. The method of claim 11, wherein the controller comprises a microprocessor that actuates the switch in accordance with the duty cycle.

13. The method of claim 12, wherein the microprocessor determines the duty cycle for actuating the switch by calculating a feed-forward duty cycle based on the power demand from the electric heating element, a resistance of the electric heating element, and a voltage output from the alternator provided to the electric heating element.

14. The method of claim 11, wherein initializing the voltage output includes applying the initial input voltage at a second field terminal of the alternator.

15. The method of claim 11, further comprising:
sensing a first current and a first voltage at the generator output terminal;
sensing a second current and a second voltage at a second field terminal of the alternator;
based, at least in part, on the first current, the first voltage, the second current, and the second voltage, calculating power demand as an adjusted target thermal energy demand.

16. The method of claim 11, wherein the controller comprises a microprocessor that selectively actuates a switch to connect a second field terminal of the alternator to a chassis ground, thereby inducing current through a coil included in the alternator based on a voltage difference between the first field terminal and the second field terminal.

17. The method of claim 11, further comprising receiving feedback from at least one sensor of the vehicle exhaust system and adjusting the power delivered to the electric heating element at the controller by adjusting a duty cycle of actuation of the switch.

18. A system for modulating power provided to an electric heating element of a vehicle exhaust system, the system comprising:
an alternator having a first field terminal, a second field terminal, and a generator output terminal;
a controller controlling a switch electrically connected between the first field terminal and a chassis ground;
an electric heating element directly electrically connected to the generator output terminal;
a voltage source electrically connected to the second field terminal;
a first diode electrically connected between the generator output terminal and the second field terminal; and
a second diode electrically connected between the voltage source and the second field terminal.

19. The system of claim 18, wherein the controller is configured to determine a power demand for the electric heating element and actuate the switch in accordance with a determined duty cycle to modulate the first field terminal, thereby causing the alternator to provide power to the electric heating element according to the power demand.

* * * * *